US006004830A

United States Patent [19]

Potter

[11] Patent Number: 6,004,830

[45] Date of Patent: Dec. 21, 1999

[54] FABRICATION PROCESS FOR CONFINED ELECTRON FIELD EMISSION DEVICE

[75] Inventor: Michael D. Potter, Churchville, N.Y.

[73] Assignee: Advanced Vision Technologies, Inc., W. Henrietta, N.Y.

[21] Appl. No.: 09/276,198

[22] Filed: Mar. 25, 1999

Related U.S. Application Data

[63] Continuation of application No. 09/020,547, Feb. 9, 1998, abandoned.

[51] Int. Cl.[6] ........................ H01L 21/100; H01L 20/100

[52] U.S. Cl. ................................ 438/20; 438/22; 438/34; 445/24

[58] Field of Search ................................ 438/20, 34, 28, 438/22; 313/308, 309, 483, 495, 106, 498, 234; 445/24, 50, 46

[56] References Cited

U.S. PATENT DOCUMENTS

| | | | |
|---|---|---|---|
| 3,766,427 | 10/1973 | Coates et al. | 315/31 R |
| 3,967,150 | 6/1976 | Lien et al. | 313/338 |
| 4,096,406 | 6/1978 | Miram et al. | 313/348 |
| 4,163,949 | 8/1979 | Shelton | 328/254 |
| 4,254,357 | 3/1981 | Haas et al. | 313/268 |
| 5,188,977 | 2/1993 | Stengl et al. | 438/20 |
| 5,214,346 | 5/1993 | Komatsu | 313/309 |
| 5,249,340 | 10/1993 | Kane et al. | 438/20 |
| 5,313,136 | 5/1994 | Van Gorkom et al. | 313/422 |
| 5,349,217 | 9/1994 | Boysel | 257/266 |
| 5,354,714 | 10/1994 | Boysel | 438/127 |
| 5,372,973 | 12/1994 | Doan et al. | 438/20 |
| 5,386,172 | 1/1995 | Komatsu | 313/309 |
| 5,386,175 | 1/1995 | Van Gorkom et al. | 313/422 |
| 5,397,957 | 3/1995 | Zimmerman | 313/309 |
| 5,426,342 | 6/1995 | Nakamura et al. | 313/496 |
| 5,461,009 | 10/1995 | Huang et al. | 438/20 |
| 5,463,269 | 10/1995 | Zimmerman | 313/309 |
| 5,504,387 | 4/1996 | Hamagishi et al. | 313/310 |
| 5,548,181 | 8/1996 | Jones | 313/309 |
| 5,569,973 | 10/1996 | Zimmerman | 313/309 |
| 5,598,056 | 1/1997 | Jin et al. | 313/495 |
| 5,614,786 | 3/1997 | Nakamura et al. | 313/497 |
| 5,619,097 | 4/1997 | Jones | 313/495 |
| 5,690,530 | 11/1997 | Jin et al. | 445/24 |
| 5,751,097 | 5/1998 | Mandelman et al. | 313/310 |
| 5,772,488 | 6/1998 | Cathey et al. | 445/50 |
| 5,798,604 | 8/1998 | Duboc, Jr. et al. | 313/495 |
| 5,898,258 | 4/1999 | Sakai et al. | 313/309 |
| 5,909,033 | 6/1999 | Koga et al. | 257/10 |
| 5,929,887 | 7/1999 | Huang | 347/122 |
| 5,930,589 | 7/1999 | Hilgers et al. | 438/20 |

OTHER PUBLICATIONS

Walter H. Kohl, "Handbook of Materials and Techniques for Vacuum Devices," Reinhold Publishing Corp., New York (1967), pp. 569–571 and 575–578.

*Primary Examiner*—Charles Bowers
*Assistant Examiner*—Evan Pert
*Attorney, Agent, or Firm*—Theodore R. Touw

[57] ABSTRACT

A lateral-emitter field emission device has a gate that is separated by an insulating layer from a vacuum- or gas-filled environment containing other elements of the device. For example, the gate may be disposed external to the microchamber. The insulating layer is disposed such that there is no vacuum- or gas-filled path to the gate for electrons that are emitted from a lateral emitter. The insulating layer disposed between the emitter and the gate preferably comprises a material having a dielectric constant greater than one. The insulating layer also preferably has a low secondary electron yield over the device's operative range of electron energies. For display applications, the insulating layer is preferably transparent. Emitted electrons are confined to the microchamber containing their emitter. Thus, the gate current component of the emitter current consists of displacement current only. This displacement current is a result of any change in potential of the gate relative to other elements such as, for example, relative to the emitter. Direct electron current from the emitter to the gate is prevented. An array of the devices comprises an array of microchambers, so that electron current from each emitter can reach only the anode in the same microchamber, even for diode devices lacking a control electrode. A fabrication process is specially adapted for fabricating the device and arrays of such devices.

26 Claims, 10 Drawing Sheets

FABRICATION PROCESS FOR CONFINED ELECTRON FIELD EMISSION DEVICE

CROSS REFERENCE TO RELATED APPLICATIONS

This application is a continuation of U.S. patent application Ser. No. 09/020,547 filed Feb. 9, 1998 (abandoned), and is also related to U.S. patent application Ser. No. 09/020,548 filed Feb. 9, 1998 (abandoned) and to its continuation filed on the same date as the present application.

FIELD OF THE INVENTION

This invention relates generally to microelectronic devices and their fabrication processes, and more particularly to a process for fabricating field emission microelectronic device having a gate electrode disposed outside a chamber containing an emitter and an anode.

BACKGROUND OF THE INVENTION

Many field-emission device structures, including diodes, triodes, and tetrodes, have been developed for use in electronic circuits. Some of the field-emission devices have been adapted specifically for use in displays. In such displays, each pixel cell uses one or more field-emission devices. Field-emission displays are considered an attractive alternative and replacement for flat-panel liquid crystal displays, because of their lower manufacturing cost and lower complexity, lower power consumption, higher brightness, and improved range of viewing angles. There is a continuing need for improved microelectronic device structures and fabrication processes, especially for flat panel displays.

NOTATIONS AND NOMENCLATURE

The terms "gate" and "gate electrode" are used interchangeably throughout the present specification and the appended claims to mean any electrode other than an emitter or anode of an electron field-emission device, whether the gate is to be used as a control electrode or extraction electrode or performs some other function. The microelectronic device may have more than one gate, and physically distinct gates may be electrically independent or may have related electrical potentials applied.

The term "lateral" refers generally to a direction parallel to a substrate on which an electronic device is formed. Thus a "lateral field-emission device" refers to a field-emission device formed on a substrate and formed with a structure such that an anode is spaced apart from a field emitter along at least a direction parallel to the substrate. Similarly, the term "lateral emitter" refers to a field emitter made substantially parallel to the substrate of a lateral device, whereby emission of electrons toward the anode occurs generally parallel to the substrate. Examples of such lateral emitters formed of thin films are known in the related art.

The term "substrate" refers to any of the following: a simple base substrate consisting of a single material, or a composite substrate consisting of a base substrate on which one or more layers of a different material have been added, or the top layer of such a composite substrate.

DESCRIPTION OF THE RELATED ART

Many field-emission device structures are known, of which it appears that a majority have been generally of the Spindt type, as described for example in U.S. Pat. No. 3,755,704. The following U.S. Pat. Nos. describe various field emission devices having lateral field emitters and/or their fabrication processes: Lambe 4,728,851; Lee et al. 4,827,177; Jones et al., 5,144,191; Cronin et al. 5,233,263 and 5,308,439; Xie et al. 5,528,099 and 5,445,550; Mandelman et al. 5,629,580; and Potter 5,616,061, 5,618,216, 5,628,663, 5,630,741, 5,644,188, 5,644,190, 5,647,998, 5,666,019, 5,669,802, 5,691,599, 5,700,176, and U.S. Pat. No. 5,703,380.

Heretofore, microelectronic field-emission devices in the related art (including Spindt type devices and lateral-emitter type devices) have had gate electrodes exposed to the same vacuum or gas-filled environment as the emitter, thus exposing the gate electrode to direct current of electrons from the field-emission cathode and allowing secondary emission to occur from the surface of the gate electrode.

PROBLEMS SOLVED BY THE INVENTION

The present invention eliminates or greatly reduces direct current flowing from the emitter to the gate of an electron field-emission microelectronic device. The invention can also reduce undesirable secondary electron emission without requiring introduction of an additional electrode for secondary-electron-emission suppression. Secondary electron emission from a gate electrode could otherwise adversely affect control of anode current by the gate electrode. In display devices, where at least a portion of the anode of each pixel is comprised of a phosphor, crosstalk between pixels is eliminated.

OBJECTS AND ADVANTAGES OF THE INVENTION

The major purpose of the invention is providing a microelectronic device having reduced gate current. A related major object of the invention is a microelectronic device having no DC path for electrons to flow from an emitter to a gate through a vacuum or gas environment. A related object is a microelectronic device having an insulating portion disposed to prevent such an electron flow path. Another related object is a microelectronic device having reduced secondary electron emission within its vacuum- or gas-filled chamber. Thus, a particular object is an electron field-emission device having an emitter and anode disposed within a vacuum- or gas-filled chamber and having a gate disposed adjacent to the chamber but separated from it. A more particular object is such a device having an insulating portion disposed between a gate and the chamber. These and other objects of the invention will become apparent from a reading of the following detailed description along with the accompanying drawings.

SUMMARY OF THE INVENTION

A lateral-emitter field emission device has a gate that is separated by an insulating layer from a vacuum- or gas-filled environment containing other elements of the device. For example, the gate may be disposed external to the microchamber. The insulating layer is disposed such that there is no vacuum- or gas-filled path to the gate for electrons that are emitted from a lateral emitter. The insulating layer disposed between the emitter and the gate preferably comprises a material having a dielectric constant greater than one. The insulating layer also preferably has a low secondary electron yield over the device's operative range of electron energies. For display applications, the insulating layer is preferably transparent. Emitted electrons are confined to the microchamber containing their emitter. Thus, the gate current component of the emitter current consists of displacement current only. This displacement current is a result of any change in potential of the gate relative to other elements such as, for example, relative to the emitter. Direct electron current from the emitter to the gate is prevented. An array of the devices comprises an array of microchambers, so that electron current from each emitter can reach only the anode in the same microchamber, even for diode devices lacking a control electrode. A fabrication process is specially adapted for fabricating the device and arrays of such devices.

DETAILED DESCRIPTION OF THE PREFERRED EMBODIMENTS

Figure 1:
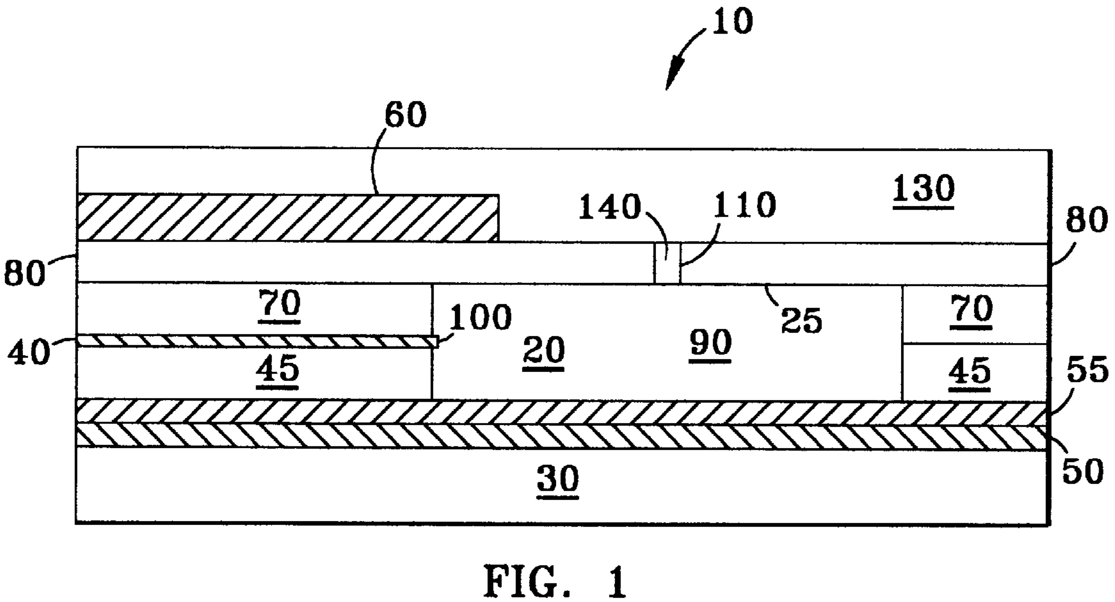
FIG. 1 shows a side elevation cross-sectional view of a microelectronic device made in accordance with the invention.

FIG. 1 shows a side elevation cross-sectional view of a microelectronic device, denoted generally by reference numeral 10. Device 10, made in a small chamber ("microchamber") 20 in a substrate 30, has a lateral emitter 40 with an emitting edge 100, an anode 50, and (optionally) a gate 60 that is external to the microchamber 20. Microchamber 20 has an inner surface 25. Preferably, an insulating layer 45 between lateral emitter 40 and anode 50 insulates the emitter from the anode and determines their spacing in the direction perpendicular to the substrate. Optionally, an insulating layer 70 spaces emitter 40 from the inner surface 25 at the top or "ceiling" of microchamber 20. An insulating layer 80 is disposed such that there is no vacuum- or gas-filled path to the gate for electrons that are emitted from the lateral emitter. In the preferred embodiment illustrated in FIG. 1, insulating layer 80 forms the ceiling or top inner surface 25 of microchamber 20. Insulating layer 80 disposed between emitter 40 and gate 60 is preferably composed of a material with low secondary electron yield over a wide range of energies and a high electric permittivity. This material is described in more detail below. The emitted electrons are confined to microchamber 20. Thus, the gate current component of the emitter current consists of displacement current only. The displacement current is a result of any change in potential of the gate relative to other elements such as, for example, the emitter element. Direct electron current from the emitter to the gate is at, or very near, zero. Furthermore, the dielectric constant (permittivity) of the insulating layer 80 and of optional insulating layer 70, is greater than the dielectric constant of vacuum. Therefore, the larger dielectric constant, together with nearly zero emitter-to-gate current, maximizes gate control of the device. For display applications, where at least a portion of the anode 50 is comprised of a phosphor 55, any crosstalk between pixels is eliminated by electron confinement. Electrons emitted from the emitter of one pixel cannot reach the anode of another adjacent or nearby pixel.

In a preferred fabrication process (described in detail hereinbelow) specially adapted for fabrication of the device, the top of microchamber 20 is penetrated by an opening 110, which is filled with a sealing material 140 later in the process.

Gate 60 may be patterned for display applications in order to avoid obscuring the anode surface. Also, gate 60 may be comprised of a transparent conductive material such as (but not limited to) tin oxide, indium oxide, or indium-tin oxide (ITO).

Similar advantages of eliminated inter-pixel crosstalk can be obtained by providing diode structures in which a diode for each pixel has electrons confined to a microchamber 20. An array of pixel cells is made in which each pixel cell comprises such a microchamber having a field emitter and an anode. Electrons emitted from each emitter are confined to the microchamber containing that emitter.

As will be seen from the detailed description below of a preferred fabrication process, the basic overall process for an array consists of providing a substrate, forming microchambers in or on the substrate and spaced apart from each other, disposing an emitter within each of the microchambers, and disposing an anode within each of the microchambers for receiving only the electrons emitted by the emitter of the same microchamber, thereby preventing crosstalk between the devices of different microchambers. If a gate electrode is to be included, a gate electrode is disposed proximate to each of the microchambers, each gate electrode being associated with the emitter of its microchamber. If necessary, an insulator is disposed to block every possible path between each emitter and its associated gate electrode for preventing DC current from flowing between that emitter and its associated gate electrode. The microchamber-forming part of this overall process is similar to the chamber-forming process described in U.S. Pat. No. 5,700,176 to the present inventor, the entire disclosure of which is incorporated herein by reference.

Preferred Fabrication Process

Figure 2A:
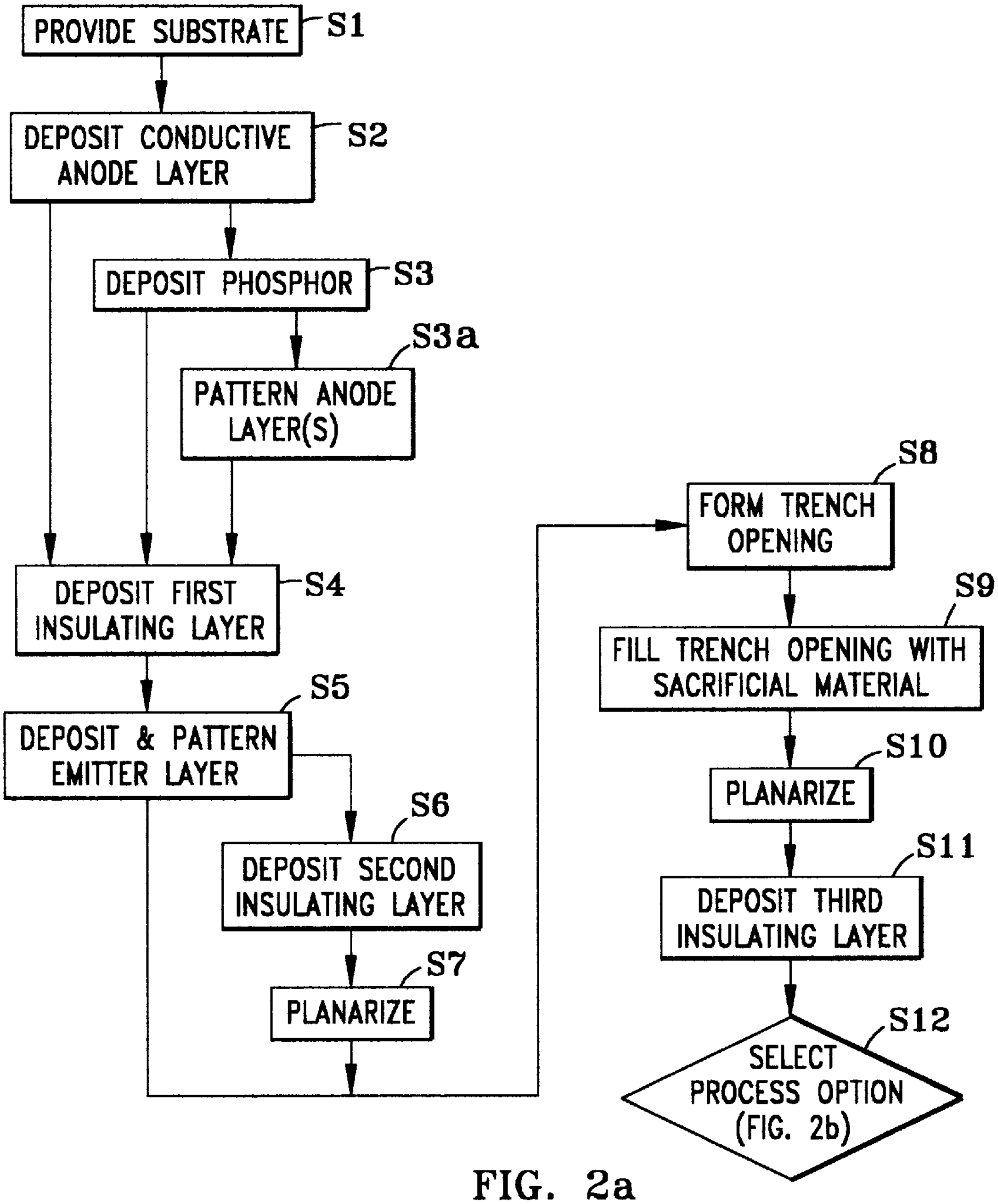
FIGS. 2*a*–2*b* together show a flow chart of a process for fabricating a microelectronic device.
Figure 2B:
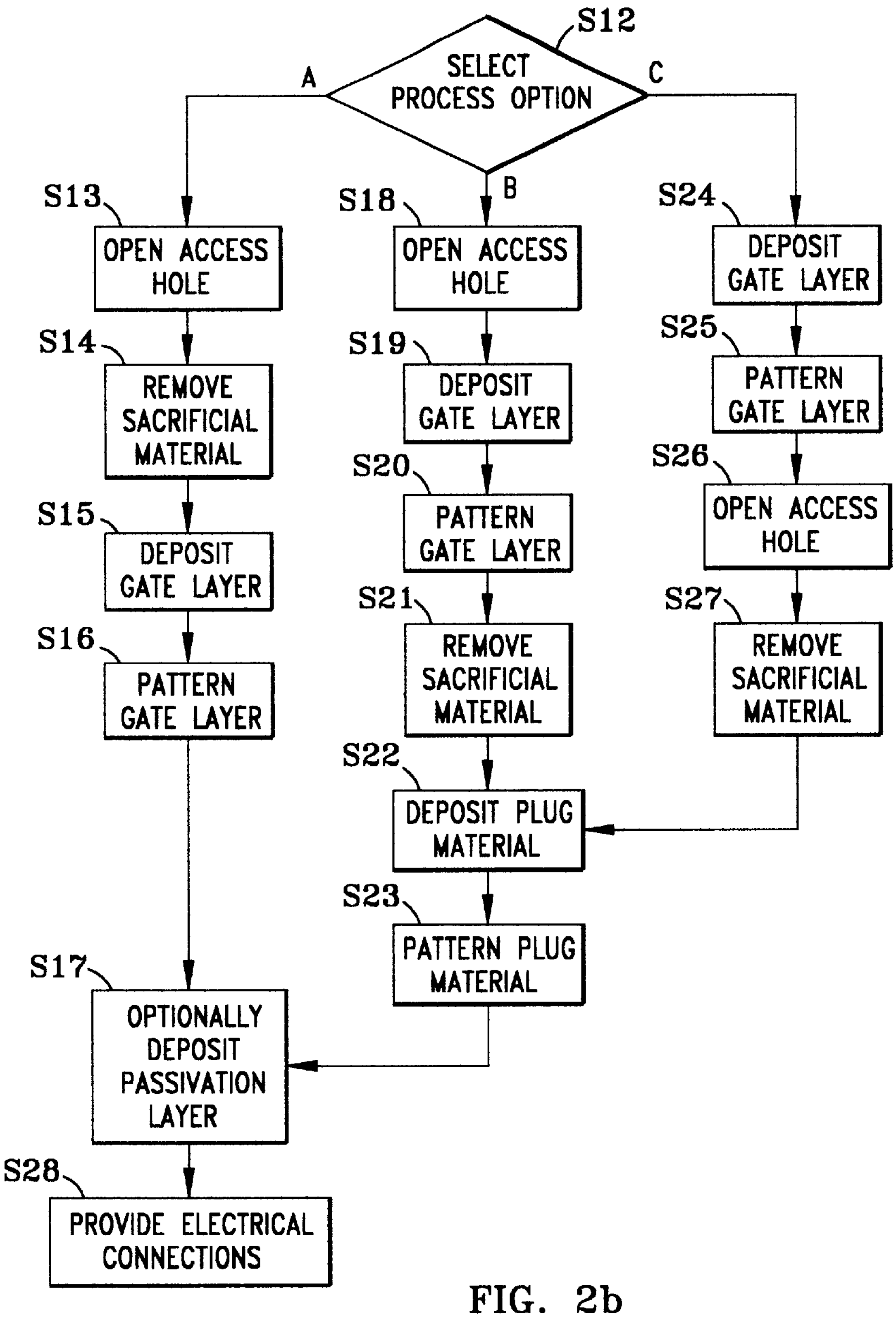
Figure 3A:
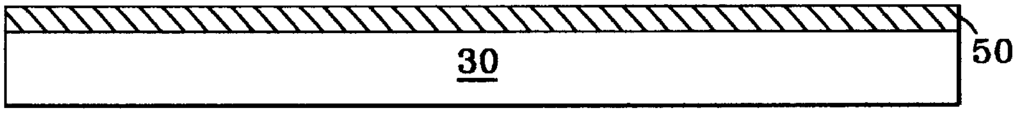
FIGS. 3*a*–3*t* show a series of side elevation cross-sectional views illustrating results of steps of a preferred fabrication process.
Figure 3B:
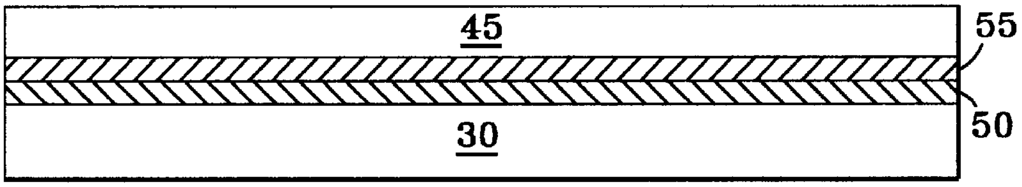

FIGS. 2*a*–2*b* together show a flow chart of a preferred process for fabricating a microelectronic device. FIGS. 3*a*–3*t* show a series of side elevation cross-sectional views illustrating results of steps of the fabrication process. The drawings are not to scale. Process steps are denoted by reference numerals S1, S2, . . . , S28.

The preferred process begins with the step S1 of providing a suitable flat substrate 30. The base substrate may be a semiconductor, such as silicon, an electrical conductor such as a metal, or an insulator, such as sapphire, glass, or silicon oxide. If the substrate is an insulator, or an insulator over a conductor, or an insulator over a semiconductor, then step S2 is performed: depositing a conductive anode layer 50 on substrate 30 (FIG. 3*a*). If the substrate is a conductor, this step S2 may be omitted. If the final structure is to include a display element, a cathodoluminescent phosphor material 55 is deposited on at least a portion of the anode 50 (step S3). If many devices are being fabricated in an array in which each device is to have an independent anode 50, then step S3 includes an additional substep S3*a* of patterning the anode layer to define the individual anode regions. In step S4, a first insulating layer 45 is deposited that later defines the emitter to anode spacing in the direction perpendicular to the substrate (FIG. 3*b*). This insulating layer 45 may be silicon dioxide ($SiO_2$), for example.

Figure 3C:
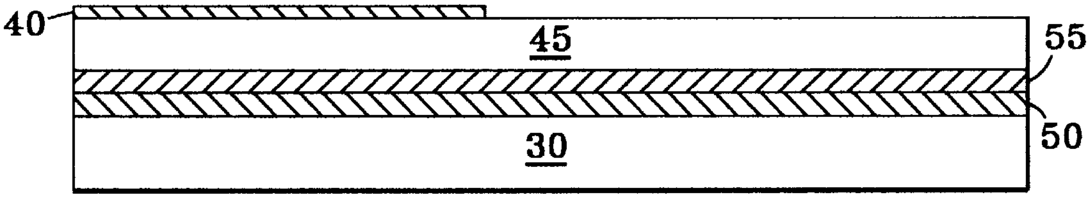
Figure 3D:
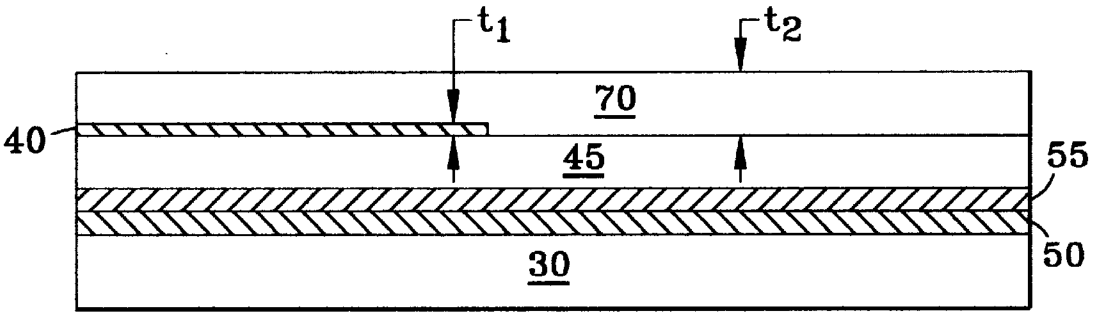

The next step S5 is depositing and patterning a thin-film emitter layer of conductive material to form an emitter 40 (FIG. 3*c*). This layer preferably consists of a conductive material having a low work function for electron emission, for example, a refractory transition element such as titanium, zirconium, hafnium, vanadium, niobium, tantalum, chromium, molybdenum, tungsten, or their combinations or alloys. A second insulating layer 70 such as $SiO_2$ is deposited (step S6) to a thickness $t_2$ equal to or greater than the emitter thickness $t_1$ (FIG. 3*d*). This insulating layer 70 may be planarized (step S7) if desired, by chemical-mechanical planarization (CMP), for example.

Figure 3E:
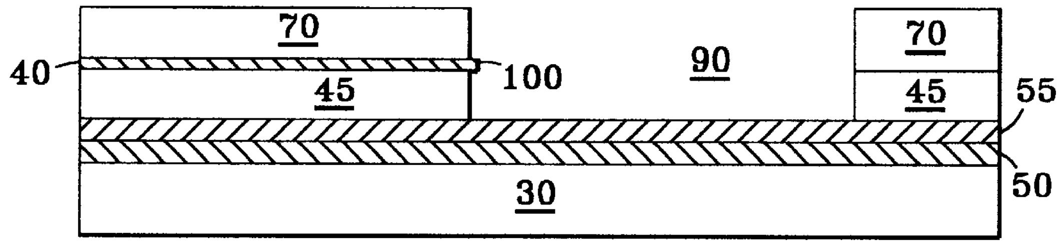

In step S8, a trench opening 90 is formed by etching through the various layers down to but not completely through the anode layer(s) (FIG. 3*e*). This etching may be done, for example, by reactive ion etching. A combination of isotropic and/or anisotropic etching is preferably used to create a desired emitting edge 100 on emitter 40, with a desired edge contour. The formation of emitting edge 100 is preferably done while forming the trench opening 90, but may be done after forming that opening. A differential etch process is chosen such that the material of lateral emitter 40 is less effected by the etch than are the sidewalls of opening 90. This leaves an ultra-thin salient emitting tip edge 100. Other possible etch processes that may be employed are chemical or electro-chemical etching, differential electropolishing, or differential ablation.

Figure 3F:
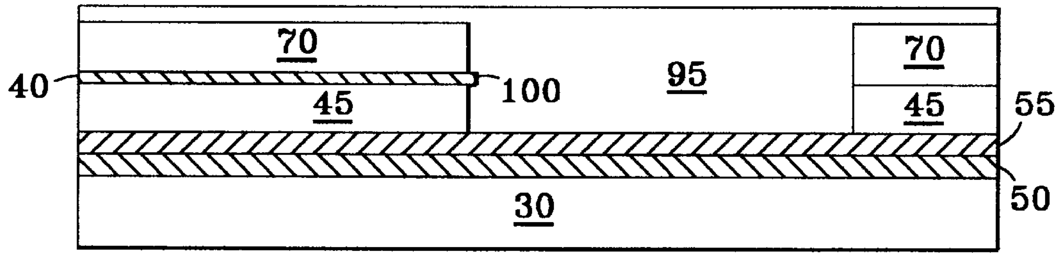
Figure 3G:
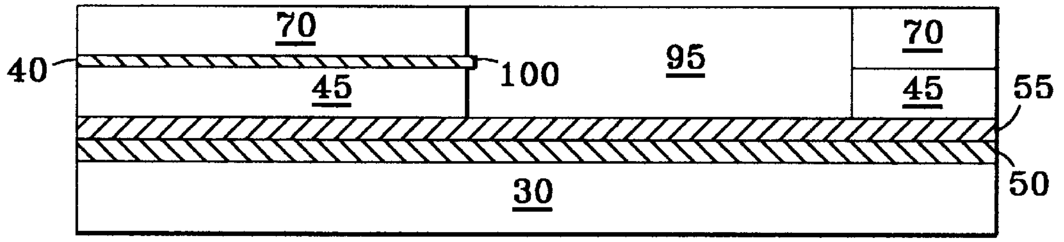
Figure 3H:
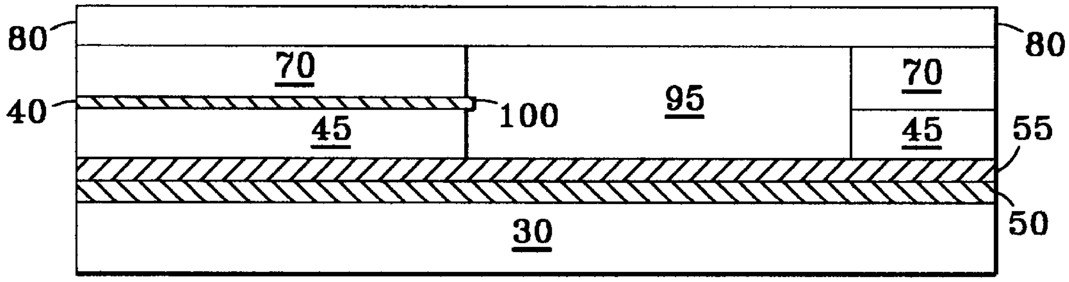

In step S9, trench opening 90 is filled with a suitable sacrificial material 95 (FIG. 3*f*). The sacrificial material may be an organic polymer such as a photoresist material (preferred), for example, or another polymeric material, such as parylene or polyimide. The resultant surface is planarized (step S10), by chemical-mechanical planarization (CMP) or other appropriate methods (FIG. 3*g*), removing any of the sacrificial material 95 from insulating layer 70 and providing a smooth flat surface for depositing the next layer. Insulating layer 80 is deposited (step S11), covering the sacrificial material 95 and the surrounding surface (FIG. 3*h*). This layer 80 is to be the layer disposed between emitter 40 and the gate 60, as shown below in reference to FIGS. 3*l*, 3*n*, and 3*s*. The thickness of layer 80 should be sufficient to support gate 60 and to withstand any pressure difference between the microchamber's interior volume and the device's ambient environment. A total thickness of insulating layer 80 of about 50 nanometers or greater will generally be suitable. At the completion of the fabrication process, the bottom surface of insulating layer 80 will form the inner surface 25 of the ceiling of microchamber 20. This layer should have low secondary electron yield, preferably over a wide range of energies including at least the operative range of energies of electrons to be emitted from emitter 40 in normal operation. Silicon nitride, glass, silicon oxide, aluminum oxide, titanium carbide (TiC), tungsten carbide (WC), vanadium diboride ($VB_2$), titanium diboride ($TiB_2$), barium titanate, strontium titanate, barium strontium titanate, or tantalum oxide are examples of suitable insulating materials for insulating layer 80. Insulating layer 80 preferably also has a high electric permittivity. Examples of particularly high-electric-permittivity insulators are tantalum oxide, barium titanate, strontium titanate, and barium strontium titanate.

Figure 4:
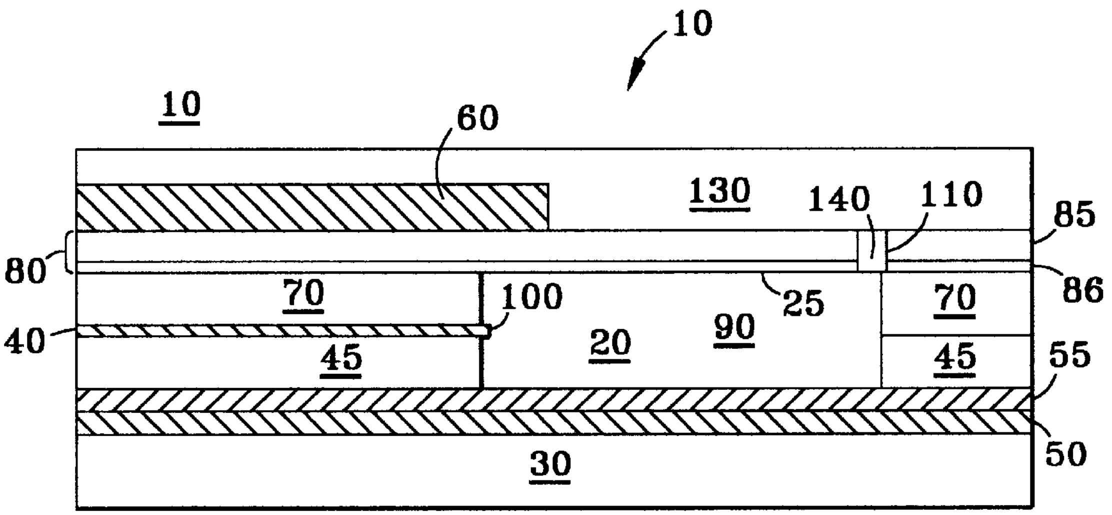
FIG. 4 shows a side elevation cross-sectional view of an alternative embodiment of a microelectronic device made in accordance with the invention.

Here the detailed description of the preferred process is interrupted to describe the alternate embodiment illustrated in FIG. 4. Insulating layer 80 may include two or more layers (85 and 86 shown in FIG. 4), for example a high permittivity layer 85 covered on its inner-surface side with a thin layer 86 of an insulator with low secondary electron yield. The materials and the order of their deposition are selected such that the first layer 85 (preferably deposited last), with higher electric permittivity at least relative to the second layer, is on the side facing away from the interior wall of the microchamber, and the second layer 86 (preferably deposited first), having lower secondary electron yield, at least relative to the first layer, forms at least a portion of the inner surface 25 of the microchamber. The material having high electric permittivity preferably has a permittivity greater than about four. The material having a low yield for secondary electron emission preferably has a secondary electron yield less than one for incident electrons within the device's operative range of electron energies, i.e. the range of electron energies occurring during normal operation of the device. It is advantageous for other reasons to operate field emission devices at relatively low anode voltages, e.g. less than 300 volts, or even less than 10 volts. Thus an operative range of electron energies will often be from zero to less than 300 electron volts or even less than 10 electron volts. An example of a two-layer composite insulating layer 80 has a high-permittivity layer 85 of barium strontium titanate about 100 nanometers thick and a low-secondary-electron-yield layer 86 of $TiB_2$ about 10 nanometers thick, the latter forming inner surface 25 at the ceiling of microchamber 20. Ideally, both properties of relatively high permittivity and relatively low secondary-electron yield are provided by the same material so that the insulating layer 80 may consist of a single layer, thus simplifying the fabrication process. Insulating layers 45 and 70 may be of the same insulating material as insulating layer 80.

At this point in the preferred fabrication process, various process options are available that may be preferred for various applications. These process options, designated A, B, and C and selected in a selection step S12, are shown as partially parallel paths in the flow chart of FIG. 2*b*, continued from the flow chart of FIG. 2*a*.

Figure 3I:
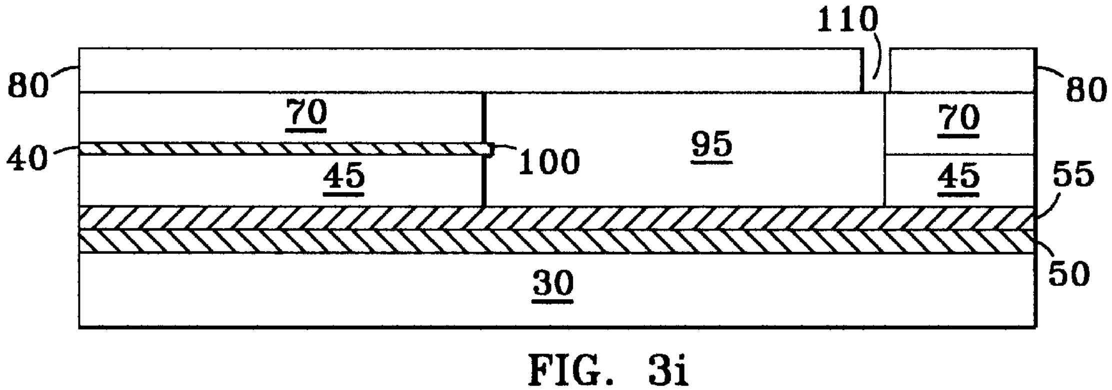
Figure 3J:
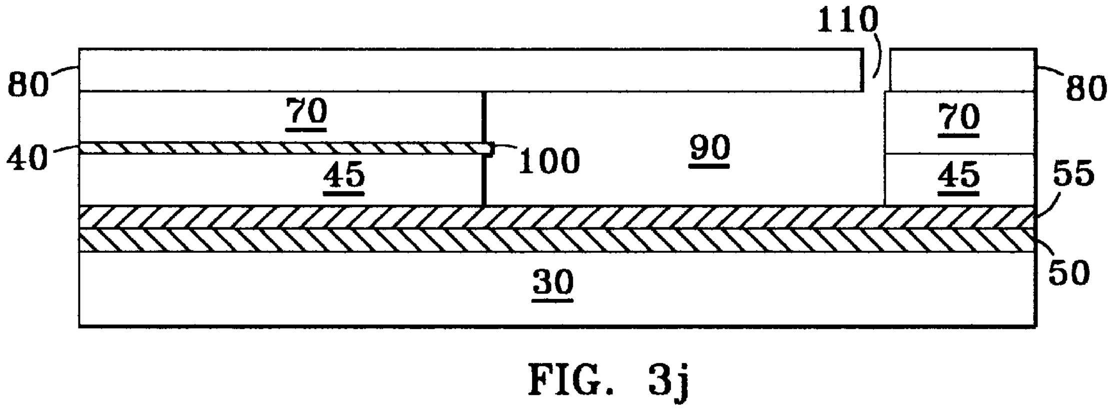
Figure 3K:
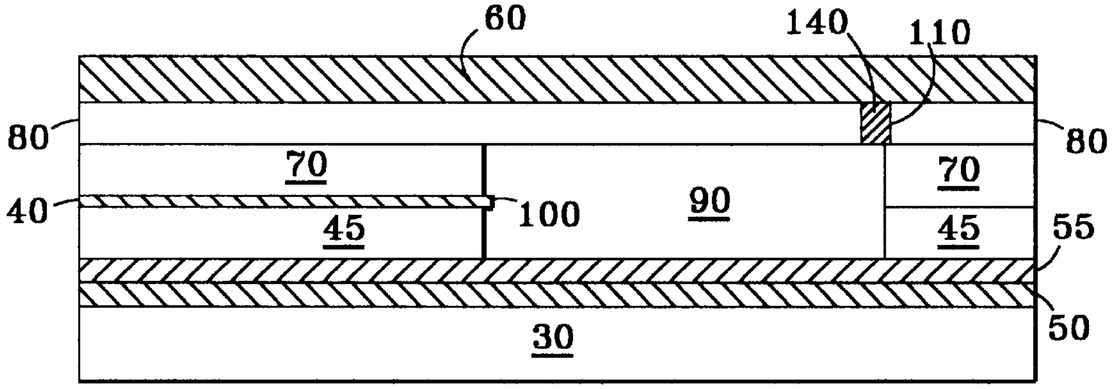
Figure 3L:
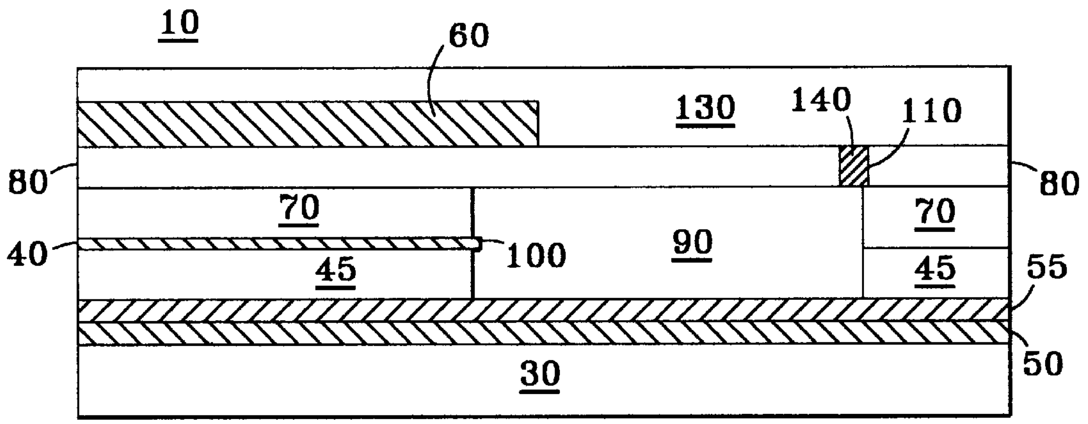

In process option A, an access hole 110 is etched (step S13) through insulating layer 70 down to the sacrificial material 95 (FIG. 3*i*). In step S14 , the sacrificial material 95 is removed through access hole 110 (FIG. 3*j*). This is preferably done by dissolution of the sacrificial material 95 with a suitable solvent and by removal of the solution, followed by rinsing and drying if necessary. Suitable solvents for the preferred photoresist sacrificial material are well-known in the art. Removal of sacrificial material 95 may alternatively be done by employing an oxygen plasma etch, for example, and by removing the etch products from sacrificial material 95 in the vacuum exhaust. In step S15, a layer of conductive material is deposited (for example by evaporation) in high vacuum conditions, to form a gate layer 120 (FIG. 3*k*). This gate layer material 120 plugs access hole 110 (forming sealing material 140), thus sealing the microchamber 20. In step S16 the gate layer is patterned to form gate 60 and unwanted material is removed, while leaving the sealing material 140 in access hole 110. For non-display devices, gate 60 may be formed of a suitable metal. For display devices, gate 60 is preferably formed of a transparent conductor, such as tin oxide, indium oxide, or indium-tin oxide (ITO). If an additional layer of passivation is desired, another insulating layer 130 is deposited in step S17 (FIG. 3*l*), completing process option A.

Figure 3M:
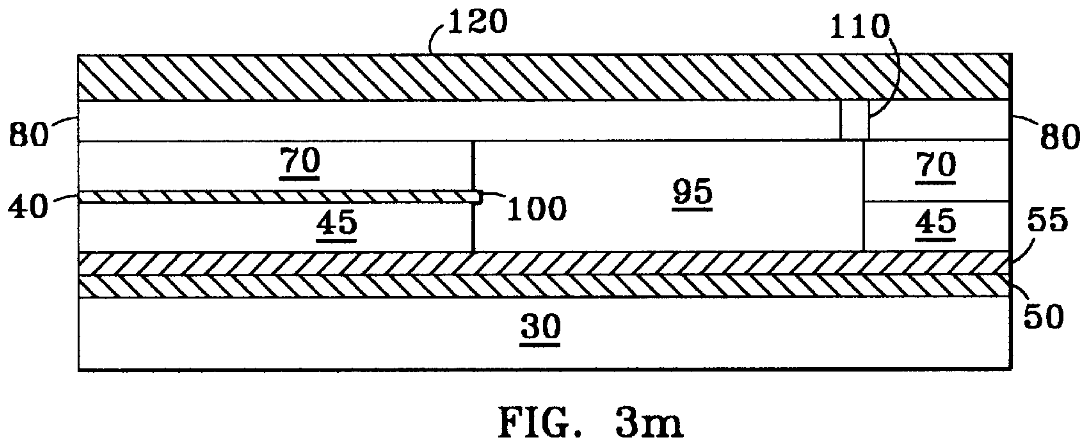
Figure 3N:
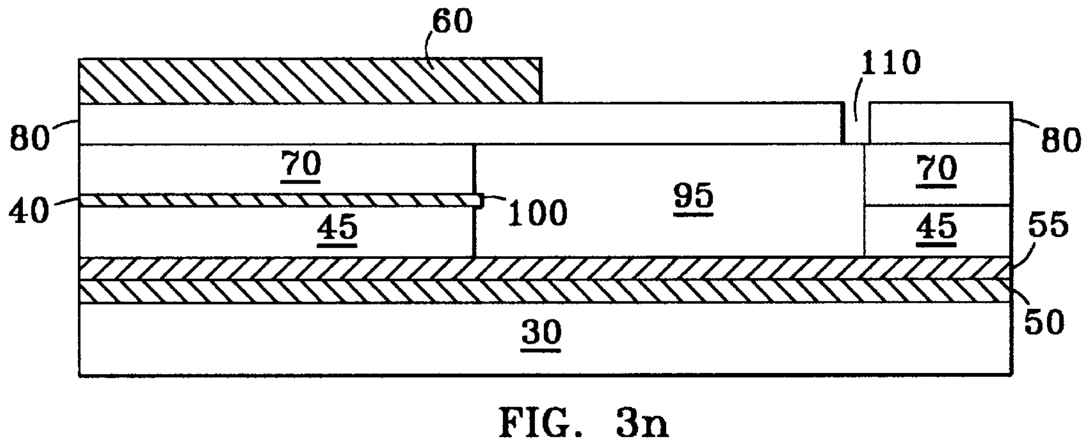
Figure 3O:
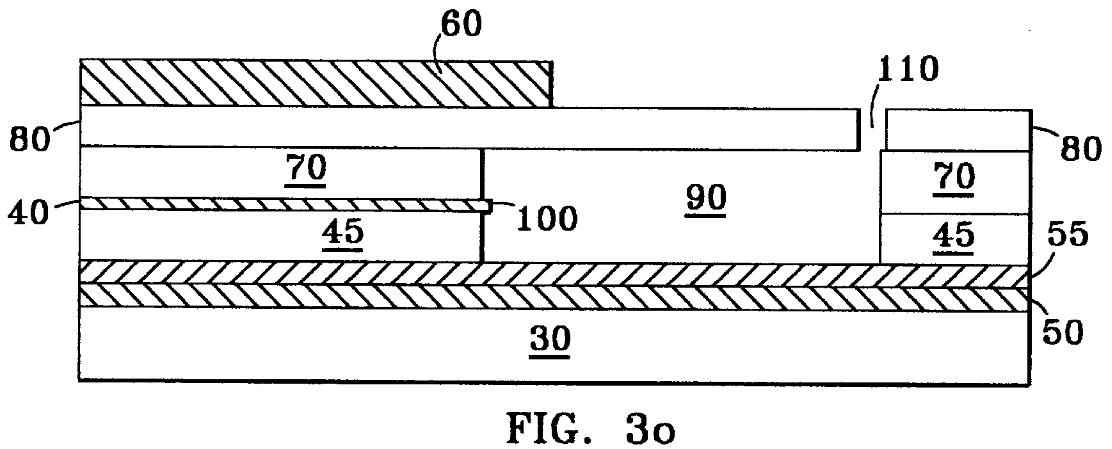
Figure 3P:
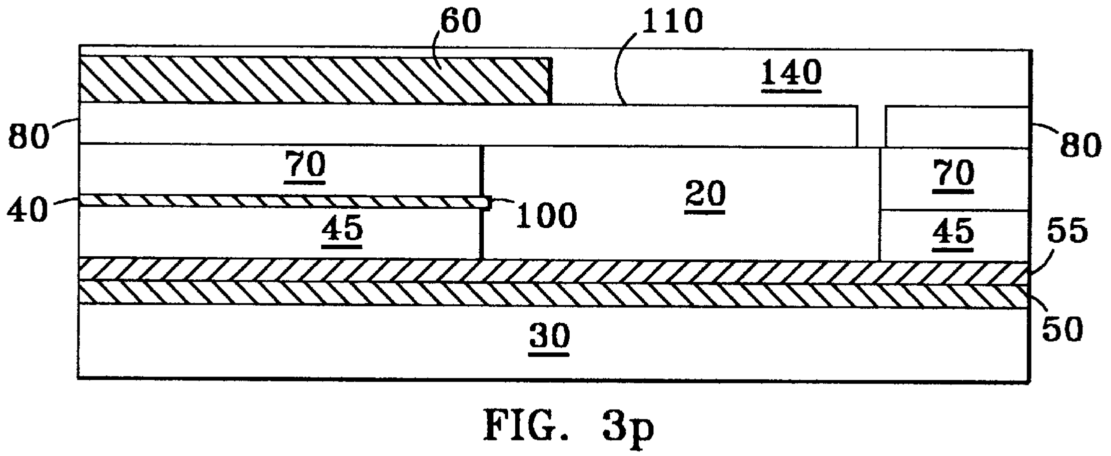
Figure 3Q:
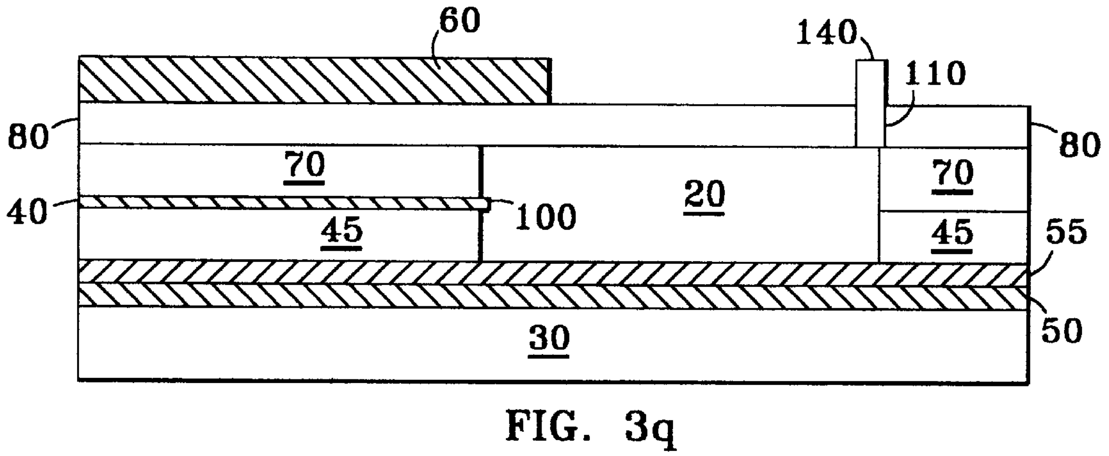

In process option B, step S18 is performed to etch an access hole 110 through the insulating layer 70 down to the sacrificial material 95, as in step S13 (FIG. 3*i*). In step S19, gate layer 120 is deposited as in step S15 (FIG. 3*m*). In step S20, gate layer 120 is patterned (and unwanted material removed) as in step S16 (FIG. 3*n*). In step S21, sacrificial material 95 is removed through access hole 110 (FIG. 3*o*). In step S22, a plug material 140 is deposited (for example by evaporation), filling access hole 110 (FIG. 3*p*). Plug material 140 may include a getter material if desired, for gettering residual or later-generated gases from the interior of microchamber 20. In step S23, plug material 140 is patterned and unwanted material is removed, while leaving at least the material 140 that plugs access hole 110 (FIG. 3*q*), completing process option B. As in process option A, an additional passivating layer 130 is deposited (step S17, FIG. 3*l*), if desired.

Figure 3R:
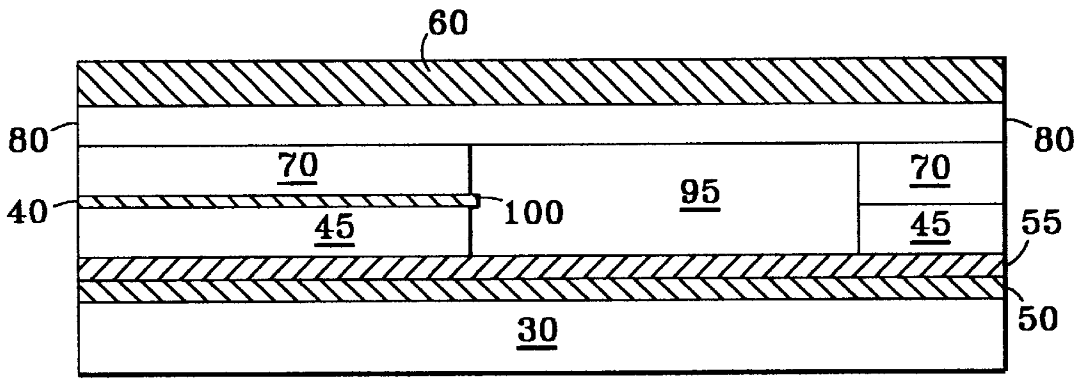
Figure 3S:
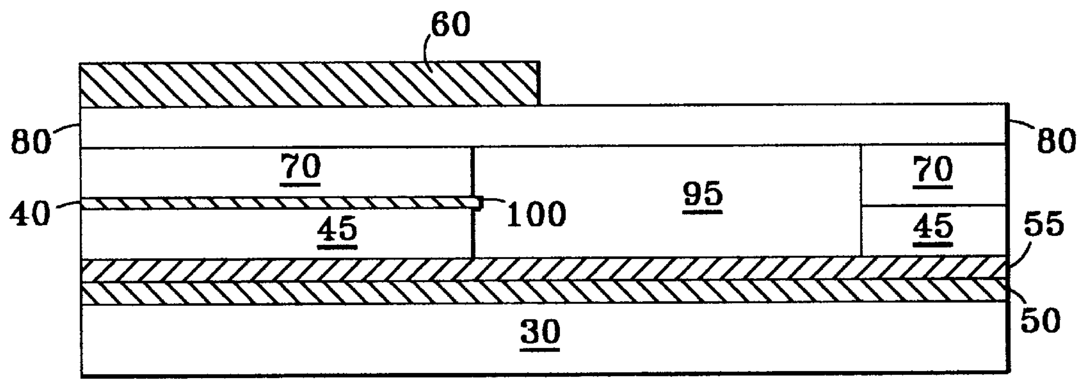
Figure 3T:
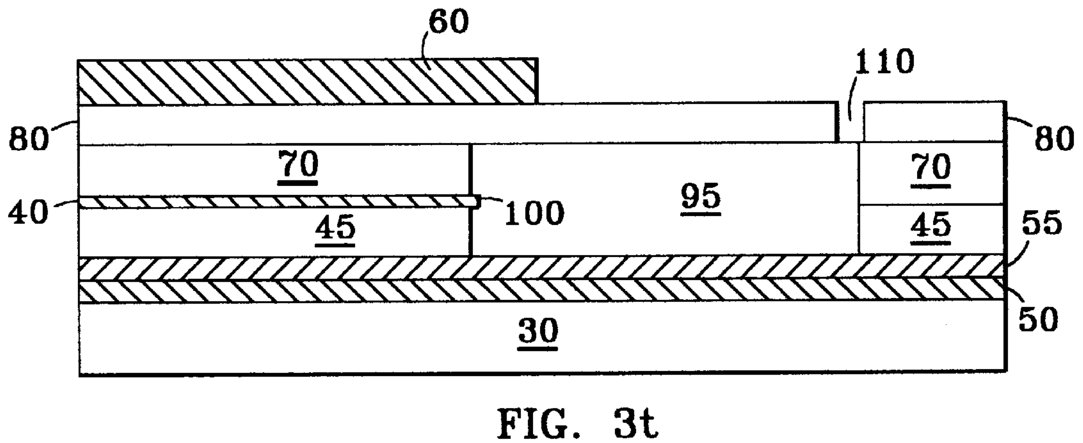

In process option C, a gate layer 120 is deposited (step S24) as in steps S15 or S19 (FIG. 3*r*). Gate layer 120 is patterned in step S25 (FIG. 3*s*). Access hole 110 is etched (step S26) through insulating layer 80 down to the sacrificial material 95 (FIG. 3*t*). In step S27, the sacrificial material 95 is removed through access hole 110, as in steps S14 or S21 (FIG. 3*o*). Process option C concludes with steps S22 (FIG. 3*p*) and S23 as in process option B (FIG. 3*l*), and step S17 (optionally) as in process options A and B.

In forming the device structure of FIG. 1, operation of the device requires means for applying suitable electrical bias voltages to the electrodes, sufficient to cause emission of electrons from the emitter to the anode, in a conventional manner for field-emission devices. Thus the completed device has conductive contacts such as wiring and vias arranged to allow connection of the appropriate supply and control voltages from outside the device. Such conductive contact arrangements are described in the patents of Potter identified hereinabove. Step S28, shown in FIG. 2*b*, is the step of providing such necessary conductive electrical connections.

INDUSTRIAL APPLICABILITY

The invention is useful in fabrication of field emission devices and is especially useful for field emission displays that consist of an array of field emission devices, since each device in the array may have a separate microchamber containing an emitter and a cathodoluminescent anode responsive only to electrons from its own emitter. If made with a gate electrode separated from each microchamber by an insulating layer, each microelectronic device has improved performance. The preferred fabrication process is specially adapted for simultaneous fabrication of many devices in such an array. Further gate electrodes (not shown), similarly isolated, may also be employed to provide two or more gate electrodes in a multi-gate device.

Although specific embodiments of the present invention have been illustrated in the accompanying drawings and described in the foregoing detailed description, it will be understood that the invention is not limited to the particular embodiments described herein. As is apparent from the foregoing description, the invention is capable of being embodied with various alterations and modifications which may differ particularly from those that have been described. For example, the order of performing steps may be changed, and functionally equivalent materials may be substituted. For another example, the microchamber may be formed by an additive process of building up walls around the chamber volume instead of the subtractive process described of forming a cavity in a substrate. The following claims are intended to encompass all such modifications. Accordingly, the scope of the invention should be determined not by the embodiments illustrated, but by the appended claims and their legal equivalents.

What is claimed is:

1. A fabrication process for microelectronic field-emission devices, comprising the steps of:

a) providing a substrate, b) forming a plurality of chambers contiguous with said substrate and spaced apart one from another;

c) disposing an emitter for emitting electrons within each of said plurality of chambers;

d) disposing an anode within each of said plurality of chambers for receiving only said electrons emitted by said emitter of the same chamber, e) disposing a gate electrode outside of each of said plurality of chambers, each said gate electrode being associated with the emitter of its proximate chamber.

2. A fabrication process as recited in claim 1, further comprising the step of:

f) disposing an insulator to block every possible path between each said emitter and its associated gate electrode for preventing DC current flowing between said emitter and said associated gate electrode.

3. A fabrication process for microelectronic field-emission devices, comprising the steps of:

a) providing a substrate, b) if necessary, disposing a conductive anode on said substrate, c) disposing a first insulating layer, d) disposing and patterning an emitter layer parallel to said substrate, e) forming a first opening for a chamber, said first opening extending through said first insulating layer, f) filling said first opening with a sacrificial material, g) disposing a second insulating layer over said sacrificial material, h) forming a second opening in said second insulating layer, i) removing said sacrificial material, j) closing said second opening to form an enclosed chamber, and k) disposing and patterning a conductive gate electrode layer to form a gate electrode spaced apart from said emitter and said anode and separated from said emitter by said second insulating layer.

4. A fabrication process as recited in claim 3, further comprising the step of 1) disposing a passivation layer over at least said conductive gate electrode layer.

5. A fabrication process as recited in claim 3, wherein said substrate-providing step (a) comprises providing a silicon substrate.

6. A fabrication process as recited in claim 3, wherein said substrate-providing step (a) comprises providing a silicon oxide substrate.

7. A fabrication process as recited in claim 3, wherein said conductive-anode-disposing step (b) comprises depositing a metal film.

8. A fabrication process as recited in claim 3, wherein said conductive-anode-disposing step (b) includes disposing a layer of cathodoluminescent phosphor.

9. A fabrication process as recited in claim 3, wherein said first-insulating-layer-disposing step (c) comprises disposing a film of silicon oxide.

10. A fabrication process as recited in claim 3, wherein said emitter-layer-disposing and pattering step (d) comprises disposing and patterning a film of a refractory metal.

11. A fabrication process as recited in claim 3, wherein said first-opening-forming step (e) comprises substeps of:

i) anisotropic etching, and ii) isotropic etching, to form a desired emitter edge while forming said first opening.

12. A fabrication process as recited in claim 3, wherein said first-opening-forming step (e) comprises reactive ion etching.

13. A fabrication process as recited in claim 3, wherein said first-opening-forming step (e) comprises plasma etching.

14. A fabrication process as recited in claim 3, wherein said first-opening-forming step (e) comprises wet etching.

15. A fabrication process as recited in claim 3, wherein said frst-opening-filling step (f) comprises filling said first opening with an organic polymer sacrificial material.

16. A fabrication process as recited in claim 3, wherein said second-insulating-layer-disposing step (g) comprises disposing a film of a substance selected from the group consisting of silicon nitride, aluminum oxide, titanium carbide, tungsten carbide, vanadium diboride, titanium diboride, barium titanate, strontium titanate, barium strontium titanate, and tantalum oxide.

17. A fabrication process as recited in claim 3, wherein said second-insulating-layer-disposing step (g) comprises:

i) disposing a first insulating sub-layer, and ii) disposing a second insulating sub-layer over said first insulating sub-layer, said first insulating sub-layer having a lower secondary-electron yield relative to said second insulating layer, and said second insulating sub-layer having a higher electric permittivity relative to said first insulating layer.

18. A fabrication process as recited in claim 3, wherein said second-opening-forming step (h) comprises wet etching.

19. A fabrication process as recited in claim 3, wherein said second-opening-forming step (h) comprises reactive ion etching.

20. A fabrication process as recited in claim 3, wherein said sacrificial-material-removing step (i) comprises oxygen plasma etching.

21. A fabrication process as recited in claim 3, wherein said second-opening-closing step (j) comprises depositing a gettering material into said second opening.

22. A fabrication process as recited in claim 21, wherein said second-opening-closing step (j) comprises depositing into said second opening a gettering material selected from the list consisting of aluminum, barium, beryllium, calcium, cerium, copper, cobalt, iron, the lanthanide elements, magnesium, misch metal, nickel, palladium, thorium, uranium, zinc, titanium, zirconium, hafnium, vanadium, niobium, tantalum, chromium, molybdenum, tungsten, and alloys, combinations, and mixtures thereof.

23. A fabrication process as recited in claim 3, wherein said second-opening-closing step (j) comprises depositing into said second opening a substance selected from the group consisting of silicon nitride, aluminum oxide, titanium carbide, tungsten carbide, vanadium diboride, titanium diboride, barium titanate, strontium titanate, barium strontium titanate, and tantalum oxide.

24. A fabrication process as recited in claim 3, wherein said conductive-gate-electrode-layer disposing and patterning step (k) comprises depositing and patterning a transparent conductive film.

25. A fabrication process as recited in claim 3, wherein said emitter-layer-disposing and patterning step (d) comprises disposing and patterning a film of a refractory metal selected from the list consisting of titanium, zirconium, hafnium, vanadium, niobium, tantalum, chromium, molybdenum, tungsten, combinations thereof, and alloys thereof.

26. A fabrication process as recited in claim 3, wherein said first-opening-filling step (f) comprises filling said first opening with a photoresist sacrificial material.

* * * * *